(12) United States Patent
Hau-Riege et al.

(10) Patent No.: US 6,725,433 B1
(45) Date of Patent: Apr. 20, 2004

(54) METHOD FOR ASSESSING THE RELIABILITY OF INTERCONNECTS

(75) Inventors: Christine Hau-Riege, Fremont, CA (US); Amit Marathe, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 70 days.

(21) Appl. No.: 10/252,680

(22) Filed: Sep. 24, 2002

(51) Int. Cl.$^7$ ............................................ G06F 17/50
(52) U.S. Cl. ................................................ 716/4; 716/5
(58) Field of Search ........................................ 716/4–5

(56) References Cited

U.S. PATENT DOCUMENTS

| | | | | |
|---|---|---|---|---|
| 5,506,450 A | * | 4/1996 | Lee et al. ................... | 257/767 |
| 5,614,764 A | * | 3/1997 | Baerg et al. ................ | 257/767 |
| 5,900,735 A | * | 5/1999 | Yamamoto ................... | 324/537 |
| 6,037,795 A | * | 3/2000 | Filippi et al. .............. | 324/763 |
| 6,349,401 B2 | * | 2/2002 | Tamaki ........................ | 716/2 |
| 6,417,572 B1 | * | 7/2002 | Chidambarrao et al. .... | 257/773 |
| 2003/0226121 A1 | * | 12/2003 | Yokogawa ..................... | 716/1 |

OTHER PUBLICATIONS

Hieu V. Nguyen et al.; Modelling of the Reservoir Effect on Electromigration Lifetime; Proceedings of 8$^{th}$ IPFA; 2001, Singapore; pp. 169–173.
S. Thrasher et al.; Blech Effect in Single–Inlaid Cu Interconnects; IITC Proceedings; 2001; pp. 177–179.

* cited by examiner

Primary Examiner—Vuthe Siek
Assistant Examiner—Paul Dinh
(74) Attorney, Agent, or Firm—Harrity & Snyder LLP

(57) ABSTRACT

A methodology for testing interconnect structures includes testing a number of short line interconnects having the same length and different reservoir sizes. By measuring and comparing the stress values on the interconnects, a relationship between reservoir area and $jL_{crit}$ may be obtained. This information may then be used to more accurately assess the reliability of an interconnect and to design more reliable interconnects.

20 Claims, 5 Drawing Sheets

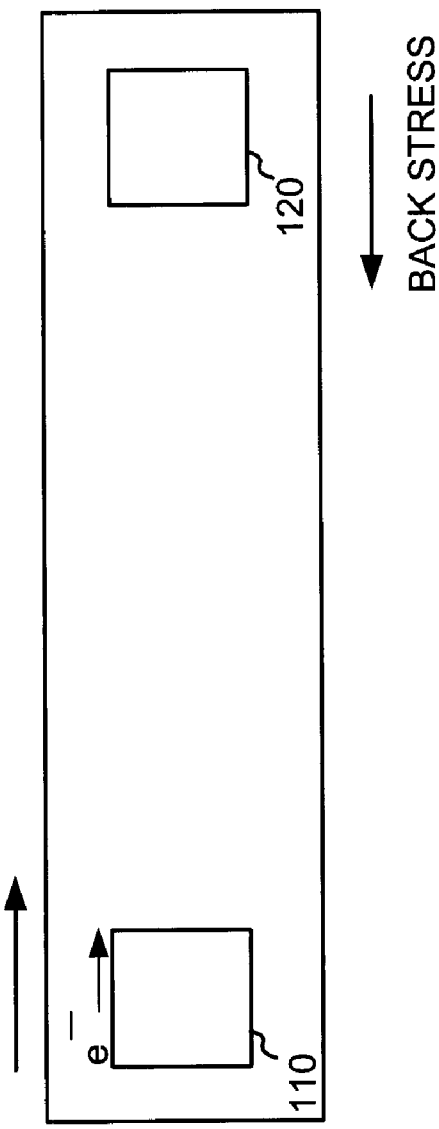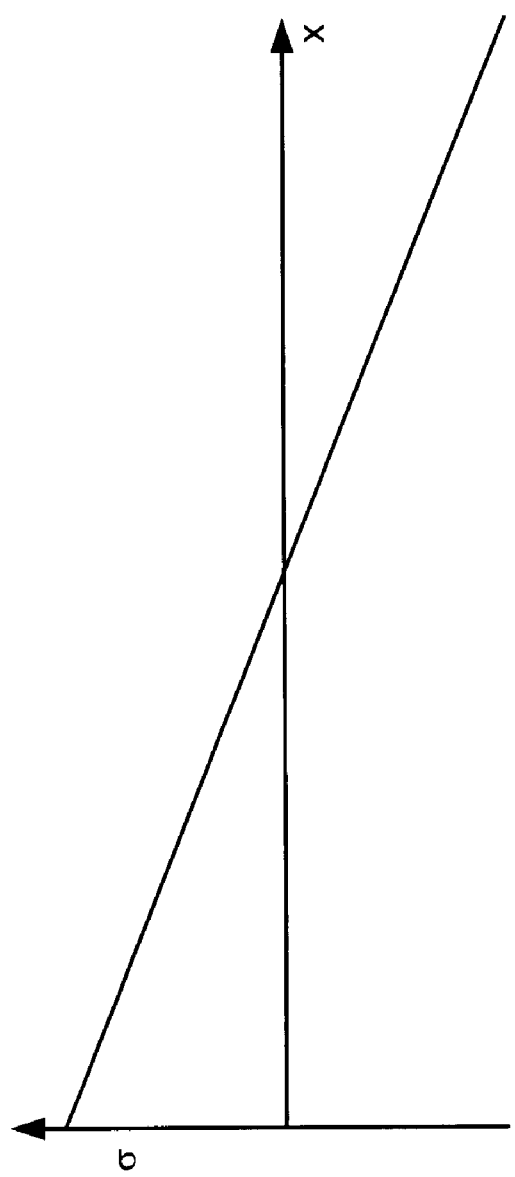

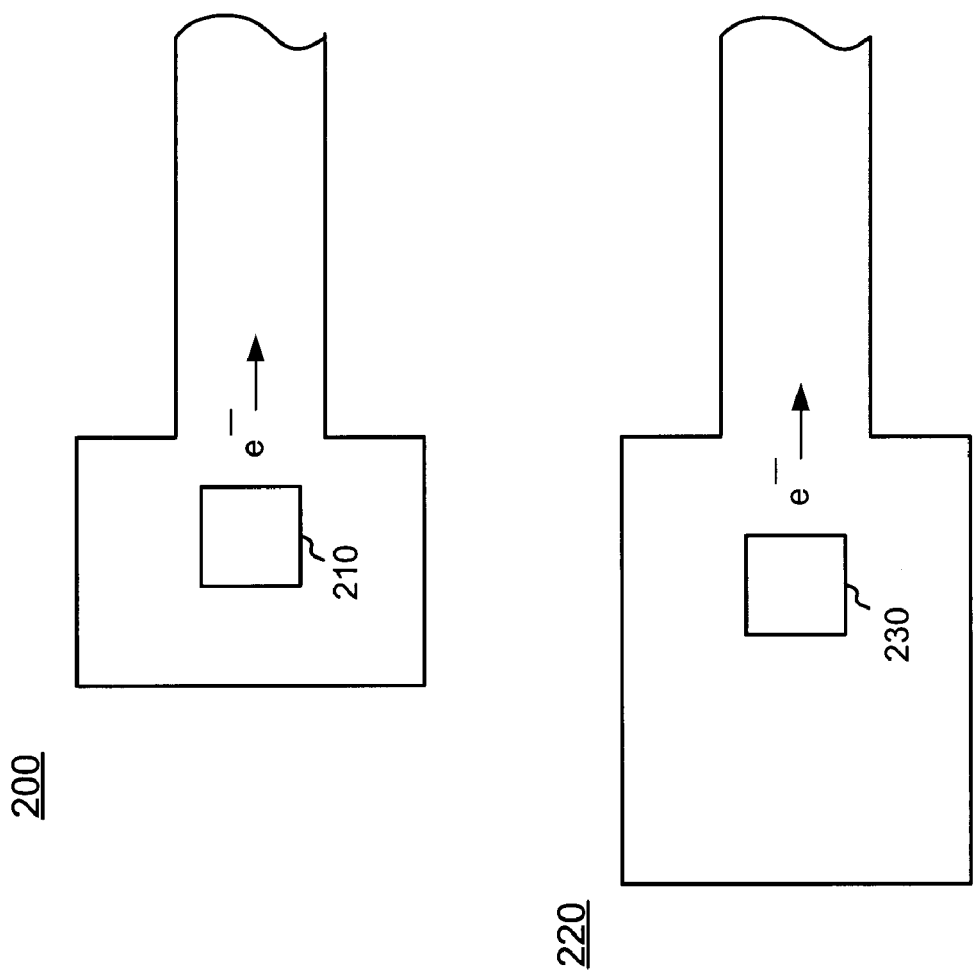

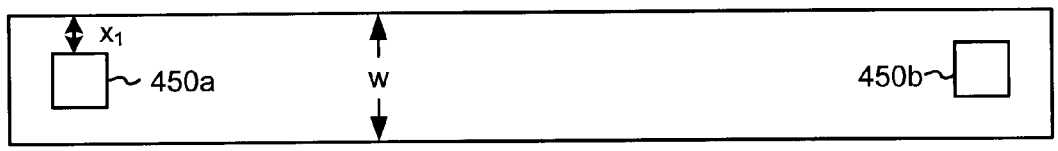
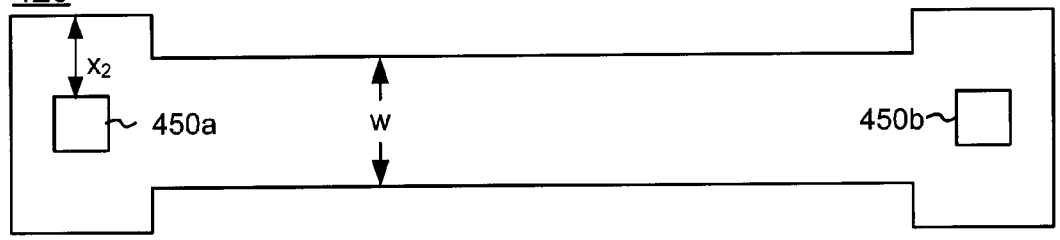
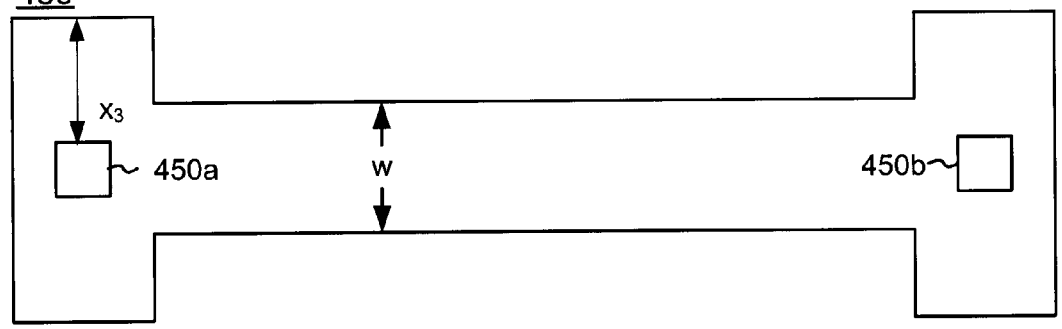
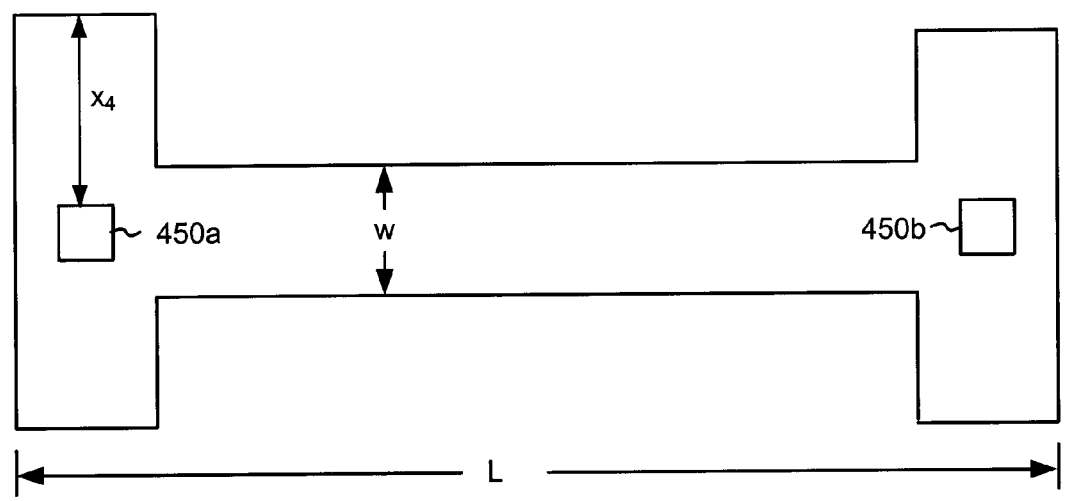
FIG. 4

METHOD FOR ASSESSING THE RELIABILITY OF INTERCONNECTS

TECHNICAL FIELD

The present invention relates generally to integrated circuits and, more particularly, to a method for testing interconnects to assess the effect of reservoir size on Blech effect.

BACKGROUND ART

Reliability is a major concern regarding integrated circuits. One particular area of concern is electromigration. As device features for transistors become smaller and operating speeds increase, the current density in a transistor's metal lines has increased. The increased current densities often lead to device failures, such as failures due to electromigration.

It has been well established that for aluminum straight line via-to-via interconnect structures, there exists a critical current density and length product ($jL_{crit}$), below which electromigration ceases and the interconnect is considered "immortal" due to a balance between the electron wind force and the opposing back stress force. This effect is known as the Blech effect. The concept of $jL_{crit}$ has more recently been reported for copper interconnects.

For example, FIG. 1A illustrates a top view of an exemplary interconnect 100 with contacts 110 and 120. The contacts 110 and 120 may represent vias that connect interconnect 100 to other metal layers and electrons may flow from contact 110 to contact 120. Referring to FIG. 1A, when the electron wind force caused by atom flux and the opposing back stress force are equal, interconnect 100 is considered immortal. That is, interconnect 100 will not experience electromigration failure.

This phenomenon implies that the tensile stress due to electromigration is maximized at the no-flux cathode line end and decreases linearly toward the no-flux anode line end. When a balance between electron wind and back stress forces is achieved, a steady-state profile results. For example, FIG. 1B is a graph illustrating the stress profile of the interconnect 100. Referring to FIG. 1B, the stress profile is linear with a maximum stress value ($\sigma$) at the cathode no-flux line end.

The increased reliability of short lines at a given current density has been well studied for straight via-to-via structures with minimal reservoirs at the line ends. The reservoir is the area at the line end that surrounds the compact/via connection point. In conventional chip reliability assessment, this increased reliability for short lines is routinely considered when assessing full chip reliability.

It has also been established that increasing the reservoir area for long lines (i.e., lines in which $jL>>jL_{crit}$) decreases stress on the interconnect caused by electromigration. Thereof, increasing the reservoir size has conventionally been considered a way to increase the median time to failure (MTF) for long interconnects.

The relationship, however, between back stress effects and line ends with significant reservoirs is not well understood and is not considered when assessing circuit reliability. In other words, conventional chip reliability assessments do not consider how the back stress for short lines is affected by the size of a reservoir. This could lead to overly optimistic reliability assessments.

DISCLOSURE OF THE INVENTION

There exists a need for a methodology that assesses the effect of reservoir size on the Blech effect.

These and other needs are met by the present invention, where the relationship between $jL_{crit}$ and reservoir area at line ends are taken into consideration by testing interconnect structures with varying reservoir areas. The test results may then be used to more realistically assess chip reliability.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to the present invention, the foregoing and other advantages are achieved in part by a method for testing interconnect structures. The method includes forming a plurality of interconnects, where each of the interconnects has two ends with a contact and a reservoir located at each of the ends. Each of the interconnects also has the same length and a different reservoir size. The method also includes supplying a voltage to each of the plurality of interconnects and measuring stress values for each of the respective interconnects. The method further includes determining a relationship between reservoir size and $jL_{crit}$, where $jL_{crit}$ represents a current density (j) and interconnect length (L) product below which an interconnect is considered to be immortal.

According to another aspect of the invention, a method for testing a plurality of interconnects is provided. Each of the interconnects includes a via located at each end of the interconnect and each of the interconnects has the same length and a different reservoir sized Each of the interconnects also has a theoretical current density and length product ($jL_{crit}$) value, below which the interconnect is considered immortal. The method includes supplying a voltage to a first one of the vias for each of the respective interconnects, where the voltage results in a first current density j on each of the interconnects such that jL for a first one of the interconnects is below its $jL_{crit}$ value. The method also includes measuring stress values for each of the respective interconnects and determining that at least one of the plurality of interconnects is not immortal at the first current density.

According to a further aspect of the invention a method of analyzing a plurality of interconnects is provided. Each interconnect has the same length (L) and a reservoir located at each-end of the interconnect, with each reservoir having a different size. The method includes applying a voltage to each of the interconnects such that a current density (j) on each of the interconnects is achieved, where jL for a first one of the interconnects is less than a theoretical $jL_{crit}$ value and the first interconnect is considered immortal. The method also includes measuring stress values for each of the plurality of interconnects and estimating a median time to failure for each of the plurality of interconnects based on the measured stress values.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIG. 1A illustrates a top view of an exemplary interconnect with via connections.

FIG. 1B is a graph illustrating the stress profile of the interconnect of FIG. 1A.

FIG. 2 illustrates the top view of exemplary interconnects with significant reservoirs.

FIG. 4 illustrates four exemplary test structures that may be formed and tested in accordance with an embodiment of the present invention.

BEST MODE FOR CARRYING OUT THE INVENTION

Figure 3:
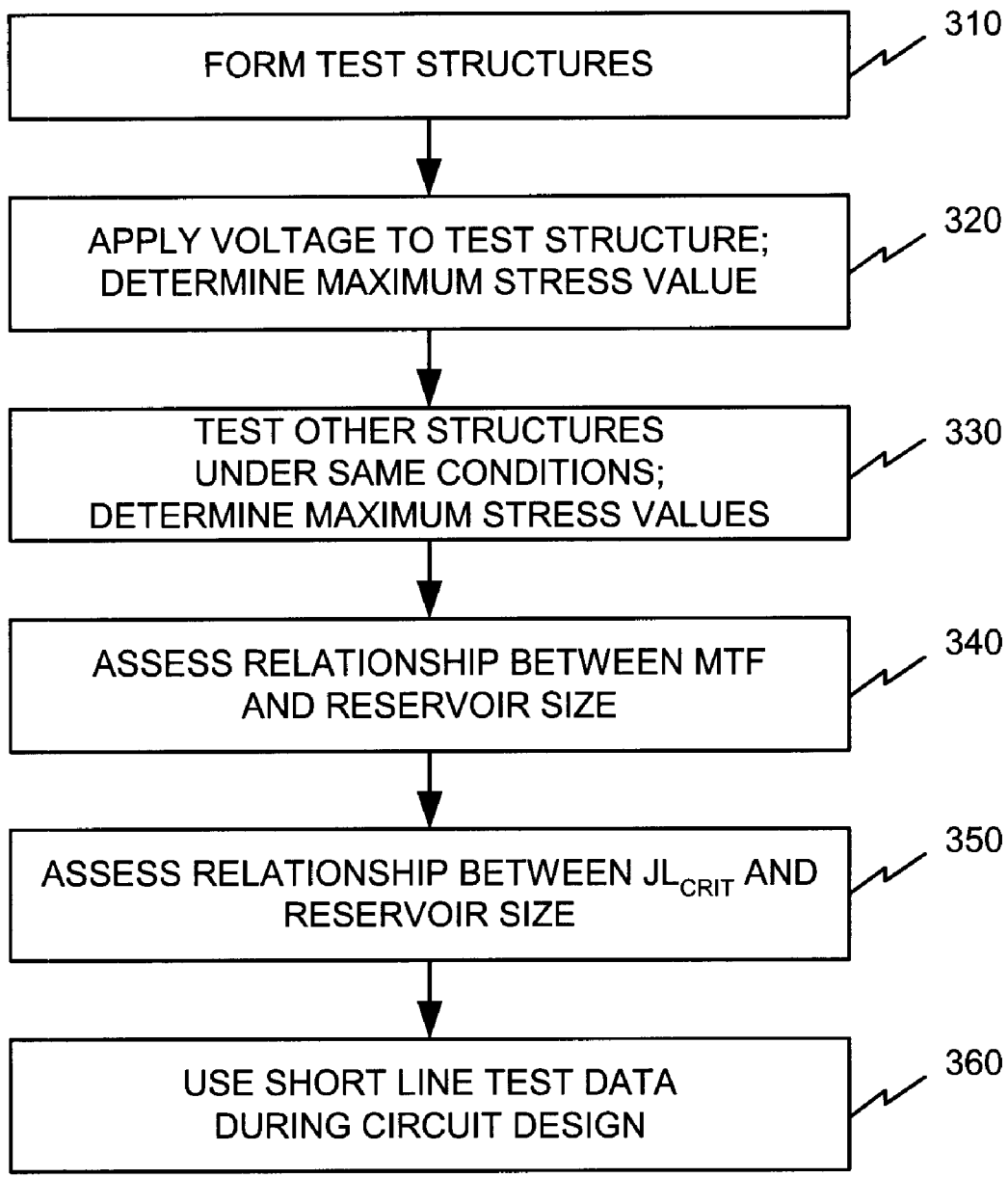
FIG. 3 is a flow diagram illustrating exemplary processing associated with testing various structures in accordance with an embodiment of the present invention.

The present invention addresses shortcomings associated with conventional reliability assessment by testing various short line interconnects having different reservoir sizes. By assessing the results of the testing, a relationship between reservoir area and $jL_{crit}$ may be obtained. This information may then be used to more accurately assess the reliability of an interconnect and to design more reliable interconnects.

As discussed previously, conventional reliability assessments do not consider the relationship between back stress effects and line ends with a significant reservoir area. For example, FIG. 2 illustrates the top view of exemplary interconnects 200 and 220 with significant reservoirs, as compared to interconnect 100 (FIG. 1A) which includes a relatively small reservoir. Referring to FIG. 2, interconnect 200 includes a relatively large reservoir around via 210 and interconnect 220 includes a large reservoir around via 230. As illustrated in FIG. 2, the orientation of the reservoir may vary. For example, interconnect 220 may include a larger reservoir area in the horizontal direction (i.e., the direction opposite the illustrated electron flow) than interconnect 200. In both interconnects 200 and 220, the reservoir area extends in the vertical direction well above the actual line connecting the vias 210 and 230 with their corresponding vias at the opposite line end.

In any event, conventional reliability assessments generally assume that larger reservoirs reduce stress and thereby increase reliability and MTF for the interconnect. For example, in conventional reliability assessment, it would be assumed that an interconnect with a large reservoir at each line end would have a higher MTF than an interconnect with the same length and a smaller reservoir. The present invention, however, provides the ability to test various interconnect strictures having the same line lengths and line widths with varying reservoir sizes. Measured stress values may then be used to more accurately assess the relationship between $jL_{crit}$ and reservoir area for relatively short lines that have significant reservoirs, as described in more detail below.

EXEMPLARY TESTING METHODOLOGY

Methodology consistent with the present invention assesses the relationship between $jL_{crit}$ and reservoir area by testing structures with varying reservoir areas, but with identical via configuration, line lengths and line widths. FIG. 3 is a flow diagram illustrating exemplary processing associated with testing various structures in accordance with an embodiment of the present invention.

Testing may begin by forming various test structures (act 310). In an exemplary embodiment, the test structures may simulate actual interconnects and may each include aluminum, copper or some other metal. For example, FIG. 4 illustrates the top view of exemplary test structures that may be formed in accordance with an embodiment of the present invention. Referring to FIG. 4, the four test structures 410, 420, 430 and 440 (also referred to as interconnects 410, 420, 430 and 440) each include vias 450a and 450b at their respective line ends. In an exemplary embodiment of the present invention, the length L of test structures 410, 420, 430 and 440 is relatively short. More particularly, the length L is selected such that there is a short line or back stress effect.

Each of interconnects 410, 420, 430 and 440 has the same line length (L) and line width (w). It should be understood that test structures having various lengths and widths may be used in accordance with the present invention.

Each interconnect 410, 420, 430 and 440 also includes the same via configuration (i.e., a single via at each line end). Interconnects 410–440, however, each have a different reservoir area at the line ends. For example, interconnect 410 is a straight line interconnect that has a minimal reservoir area around vias 450a and 450b. That is, the distance from the top of vias 450a and 450b to the end of the interconnect 410 in the vertical direction (labeled as $x_1$ in FIG. 4) is very small.

The reservoir size for interconnects 420, 430 and 440 are significantly larger than the reservoir size of interconnect 410. For example, the distances from the top of vias 450a and 450b to the end of the reservoir portion of interconnects 420, 430 and 440 in the vertical direction are labeled as $x_2$, $x_3$ and $x_4$, respectively. In the exemplary implementation illustrated in FIG. 4, $x_1 < x_2 < x_3 < x_4$. In addition, in implementations consistent with the present invention, the size of x may, in some instances (e.g., $x_4$), be much greater than the cross-sectional length and width of the via itself (e.g., via 450a or 450b).

Interconnect 410 may then be tested (act 320). In an exemplary implementation of the present invention, a voltage may be applied to interconnect 410, for example, to via 450a, to produce a current density (j) throughout interconnect 410 such that $jL < jL_{crit}$ at a selected test temperature. In other words, the testing conditions are selected so that the interconnect with the minimal reservoir (i.e., interconnect 410) is immortal. The stress on interconnect 410 may then be measured at a variety of points.

For example, the tensile stress may be measured at a number of locations including via 450a and the reservoir at each of the line ends. After measuring the stress values, a maximum stress value in mega Pascals (MPa), for example, may be determined (act 320).

After testing associated with interconnect 410 has been completed, the other interconnects 420, 430 and 440 may be tested in a similar manner (act 330). That is, the tests for interconnects 420, 430 and 440 are performed with the same current density and temperature conditions being applied as those that were used to test interconnect 410. This ensures that the only variable that has been modified for the additional tests is the reservoir size. Similar to the discussion above with respect to interconnect 410, the stress value may be measured at a number of points along each of interconnects 420, 430 and 440. The maximum stress values for each of interconnect 420, 430 and 440 may then be determined (act 330).

The maximum stress values for interconnects 410–440 may then be used to determine a relationship between MTF and reservoir size for short lines, i.e., lines that experience a back stress effect (act 340). For example, from testing structures, such as interconnects 410–440, it has been found that the maximum stress value for a short line with a large reservoir, such as interconnect 410. This increased stress may result in fatal voids or other electromigration-related problems that may lead to interconnect failures. This is in contrast to conventional assessments which assume that interconnect 440 would be immortal at the same j and L as interconnect 410. More particularly, it has been found that the MTF may vary inversely with respect to the reservoir area (i.e., the MTF may decrease as reservoir area increases). For example, the MTF for interconnect 440 may be less than the MTF for interconnect 430.

Figure 5:
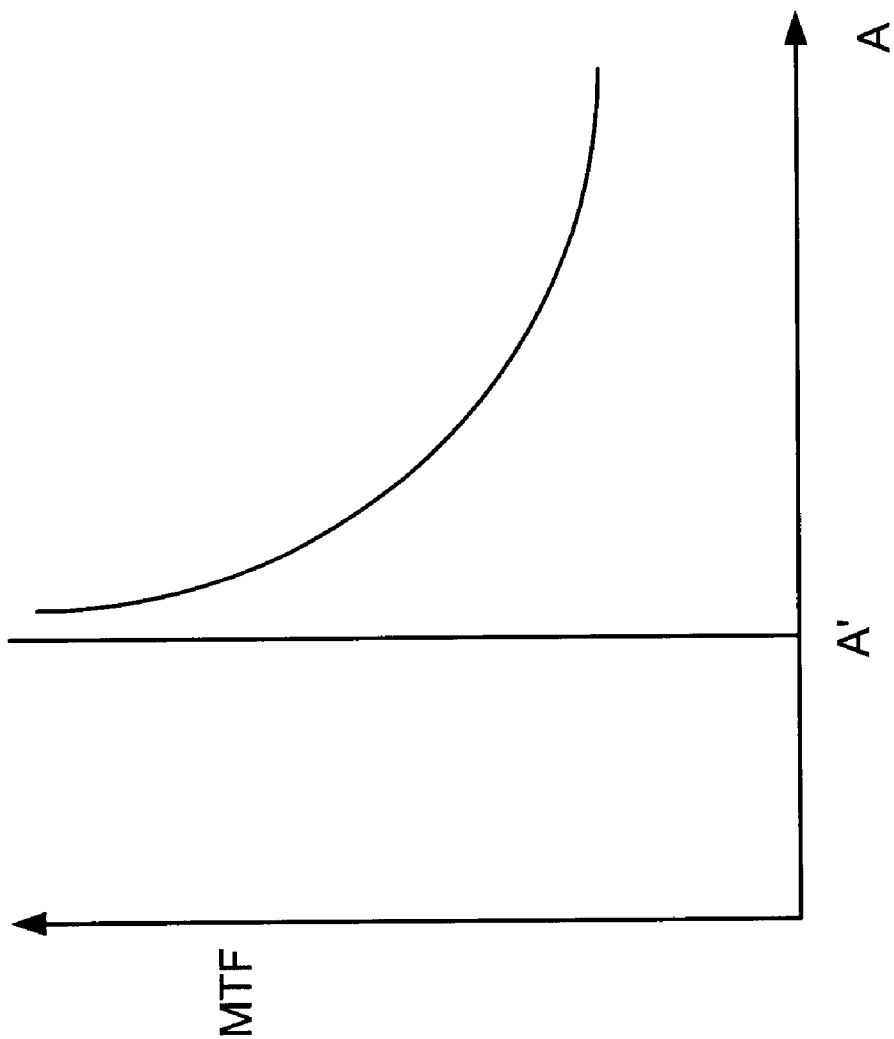
FIG. 5 is a graph illustrating an exemplary plot of median time to failure versus reservoir area in accordance with the present invention.

FIG. 5 illustrates an exemplary plot of MTF versus reservoir area (A). Referring to FIG. 5, when the reservoir area of the interconnect is at or below A', MTF is equal to infinity (i.e., the interconnect is immortal). However, as the area of the interconnect increases above A', the MTF decreases. Based on the exemplary interconnects 410–440, the reservoir area for interconnect 410 would be below A'. The reservoir area for one or more of interconnects 420, 430 and 440, however, may be above A'. Once again, this is in contrast to conventional reliability assessments in which it is assumed that the larger the reservoir, the lower the electromigration and the higher the MTF.

The maximum stress values for the interconnects may also be used to determine a relationship between $jL_{crit}$ and reservoir size (act 350). For example, as discussed above, from testing structures such as interconnects 410, 420, 430 and 440, it has been found that even though an interconnect may be immortal at a given current density j and length L, other interconnects having the same j and L may not be immortal due to the increased reservoir size. This is contrast to conventional assessments which would assume that interconnects having the same j and L would all be immortal if one of the interconnects was immortal.

As a result of the increased stress caused by the increased reservoir size, the $jL_{crit}$ values for interconnects 410, 420, 430 and 440 may vary. For example, the $jL_{crit}$ values may vary inversely with respect to reservoir size. In other words, the $jL_{crit}$ value for interconnect 420 may be lower than the $jL_{crit}$ value for interconnect 410 as a result of its larger reservoir. In this case, for interconnect 420 to achieve immortality at a given current density j, its length (L) will have to be reduced as compared to interconnect 410 at the same current density j. In other words, the $jL_{crit}$ values may vary with respect to reservoir area in a similar manner as the MTF values vary with reservoir area as illustrated in FIG. 5.

Circuit designers may use the information gathered from testing various short line structures when designing circuits (act 360). For example, by knowing that short lines with significant reservoirs may experience increased stress as compared to short lines without significant reservoirs, a circuit designer will be able to lay out circuits that include interconnects that exhibit increased reliability.

In summary, the present invention uses a systematic methodology to test various structures to assess the effect of reservoir size on the Blech effect. By testing various structures having varying reservoir sizes, the effects of reservoir size on electromigration and stress can be quantified and relationships between reservoir size and MTF, $jL_{crit}$ and, ultimately, circuit reliability may be obtained. An advantage of the invention is that conventional assumptions regarding reservoir size are ignored and more accurate reliability assessments may be achieved. Another advantage of the invention is that circuit designers may use the test data to design more reliable circuits.

In the previous descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention.

The test structures used in accordance with the present invention can be formed using conventional techniques. For example, conventional metallization, photolithographic and etching techniques may be employed, and hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A method for testing interconnect structures, comprising:

forming a plurality of interconnects, each of the interconnects having two ends with a contact and a reservoir located at each of the ends, wherein each of the interconnects has the same length and a different reservoir size;

supplying a voltage to each of the plurality of interconnects;

measuring stress values for each of the respective interconnects; and determining a relationship between reservoir size and $jL_{crit}$ where $jL_{crit}$ represents a current density (j) and interconnect length (L) product below which an interconnect is considered to be immortal.

2. The method of claim 1, wherein the determining a relationship comprises:

determining that a first one of the interconnects having a first reservoir has a lower $jL_{crit}$ value than a second one of the interconnects having a second reservoir, where the first reservoir is larger in area than the second reservoir.

3. The method of claim 1, wherein the measuring stress values comprises:

measuring tensile stress values at a plurality of locations on each of the interconnects, and identifying a maximum tensile stress value for each of the respective interconnects.

4. The method of claim 3, further comprising:

determining that a first one of the interconnects having a first reservoir has a higher estimated median time to failure than a second one of the interconnects having a second reservoir, wherein the first reservoir has a smaller area than the second reservoir.

5. The method of claim 1, further comprising:

using the determined relationship to design integrated circuits having increased reliability.

6. The method of claim 1, wherein each of the plurality of interconnects comprises aluminum.

7. The method of claim 1, wherein each of the plurality of interconnects comprises copper.

8. The method of claim 1, further comprising:

determining that a first one of the interconnects having a first reservoir has a smaller maximum stress value than a second one of the interconnects having a second reservoir, where the first reservoir is smaller in area than the second reservoir.

9. A method for testing a plurality of interconnects, each of the interconnects including a via located at each end of the interconnect and each of the interconnects having a same length (L) and a different reservoir size, and wherein each of the interconnects has a theoretical current density and length product ($jL_{crit}$) value, below which the interconnect is considered immortal, the method comprising:

supplying a voltage to a first one of the vias for each of the respective interconnects, the voltage resulting in a first current density j on each of the interconnects, such that jL for a first one of the interconnects is below its $jL_{crit}$ value;

measuring stress values for each of the respective interconnects; and determining that at least one of the plurality of interconnects is not immortal at the first current density.

10. The method of claim 9, further comprising:

determining a relationship between electromigration in the plurality of interconnects and reservoir size based on the measured stress values.

11. The method of claim 9, further comprising:

determining that the $jL_{crit}$ values for the plurality of interconnects varies with reservoir size.

12. The method of claim 9, wherein each of the plurality of interconnects comprises aluminum.

13. The method of claim 9, wherein each of the plurality of interconnects comprises copper.

14. The method of claim 9, further comprising:

generating an estimated median time to failure for at least one of the interconnects based on the measured stress values.

15. The method of claim 14, further comprising:

identifying a reservoir size for an interconnect above which the corresponding interconnect is not immortal.

16. A method of analyzing a plurality of interconnects, each interconnect having a length (L) and a reservoir located at each end of the interconnect, wherein each of the interconnects has a different reservoir size, the method comprising:

applying a voltage to each of the interconnects such that a current density (j) on each of the interconnects is achieved, wherein jL for a first one of the interconnects is less than a theoretical $jL_{crit}$ value and the first interconnect is considered immortal;

measuring stress values for each of the plurality of interconnects; and estimating a median time to failure for each of the plurality of interconnects based on the measured stress values.

17. The method of claim 16, wherein each of the interconnects is relatively short and experiences a back stress effect and the first interconnect is a straight line interconnect with a relatively small reservoir size.

18. The method of claim 16, wherein each interconnect comprises at least one of aluminum and copper and includes a via at each respective end.

19. The method of claim 16, further comprising:

identifying a relationship between reservoir size and median time to failure for the plurality of interconnects.

20. The method of claim 19, wherein the relationship indicates that an interconnect with a larger reservoir size has a lower median time to failure than an interconnect with a smaller reservoir size.

* * * * *